(12) United States Patent
Xie et al.

(10) Patent No.: US 12,272,648 B2
(45) Date of Patent: Apr. 8, 2025

(54) SEMICONDUCTOR DEVICE HAVING A BACKSIDE POWER RAIL

(71) Applicant: INTERNATIONAL BUSINESS MACHINES CORPORATION, Armonk, NY (US)

(72) Inventors: Ruilong Xie, Niskayuna, NY (US); Junli Wang, Slingerlands, NY (US); Julien Frougier, Albany, NY (US); Dechao Guo, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 17/840,677

(22) Filed: Jun. 15, 2022

(65) Prior Publication Data

US 2023/0411293 A1 Dec. 21, 2023

(51) Int. Cl.
*H10D 30/62* (2025.01)
*H01L 23/528* (2006.01)
(Continued)

(52) U.S. Cl.
CPC ..... *H01L 23/5286* (2013.01); *H10D 30/6219* (2025.01); *H10D 84/0186* (2025.01);
(Continued)

(58) Field of Classification Search
CPC ......... H01L 23/5286; H01L 21/823821; H01L 21/823871; H01L 27/0924; H01L 29/41791; H01L 21/76898; H01L 23/535
See application file for complete search history.

(56) References Cited

U.S. PATENT DOCUMENTS 7,002,187 B1 2/2006 Husher
9,570,395 B1 2/2017 Sengupta
(Continued)

FOREIGN PATENT DOCUMENTS

EP 3454366 A1 3/2019
TW 202143392 A 11/2021
TW 202201639 A 1/2022

OTHER PUBLICATIONS

Gupta et al., "Buried Power Rail Integration with Si FinFETs for CMOS Scaling beyond the 5 nm Node", 978-1-7281-6460-1/20, © 2020 IEEE, 2 pps.
(Continued)

*Primary Examiner* — Karen Kusumakar
*Assistant Examiner* — Adam S Bowen
(74) *Attorney, Agent, or Firm* — David K. Mattheis

(57) ABSTRACT

A semiconductor device includes a plurality of field effect transistors (FET) formed upon semiconductor fins. Each FET includes a gate disposed transversely upon a first portion of the fins of the FET, one or more source/drain regions disposed upon the fins and in contact with the gate, and an electrically isolating layer disposed adjacent to a second portion of the fins above the gate and the source/drain regions, the electrically isolating layer having an interface with the gate. The device further includes a buried power rail (BPR) disposed between otherwise adjacent FETs. The BPR includes a metal rail extending beyond the interface into the gate, and electrically isolating sidewalls separating the metal rail from the gate and the source/drain regions. The device also includes a via-buried power rail contact disposed adjacent to the electrically isolating sidewalls, in contact with the metal rail, and in contact with one source/drain region.

19 Claims, 27 Drawing Sheets

(51) Int. Cl.
- *H10D 84/01* (2025.01)
- *H10D 84/03* (2025.01)
- *H10D 84/85* (2025.01)

(52) U.S. Cl.
CPC ....... *H10D 84/0193* (2025.01); *H10D 84/038* (2025.01); *H10D 84/853* (2025.01)

(56) References Cited

U.S. PATENT DOCUMENTS

| | | |
|---|---|---|
| 10,475,692 B2 | 11/2019 | Licausi |
| 10,985,103 B2 | 4/2021 | Hong |
| 2018/0026042 A1 | 1/2018 | Smith |
| 2019/0267374 A1 | 8/2019 | Hung |
| 2019/0386011 A1 | 12/2019 | Weckx |
| 2020/0105671 A1 | 4/2020 | Lai |
| 2020/0134128 A1 | 4/2020 | Peng |
| 2020/0135578 A1 | 4/2020 | Ching |
| 2020/0135634 A1 | 4/2020 | Chiang |
| 2020/0266169 A1 | 8/2020 | Kang |
| 2021/0035860 A1 | 2/2021 | Dentoni Litta |
| 2021/0134721 A1 | 5/2021 | Chiang |
| 2021/0202385 A1 | 7/2021 | Huang |
| 2021/0305428 A1 | 9/2021 | Ju |
| 2021/0375861 A1* | 12/2021 | Chung ............... H01L 29/785 |
| 2021/0399099 A1 | 12/2021 | Chu |
| 2022/0157722 A1* | 5/2022 | Bouche ............... H01L 23/535 |
| 2022/0181318 A1 | 6/2022 | Liebmann |
| 2022/0310514 A1* | 9/2022 | Wei ............... H01L 23/5286 |
| 2022/0375860 A1 | 11/2022 | Huang |

OTHER PUBLICATIONS

Gupta et al., "Buried Power Rail Scaling and Metal Assessment for the 3 nm Node and Beyond", 2020 IEEE International Electron Devices Meeting (IEDM), DOI: 10.1109/IEDM13553.2020.9371970, 4 pages.

Mathur et al., "Buried Bitline for sub-5nm SRAM Design", 2020 IEEE International Electron Devices Meeting (IEDM), DOI: 10.1109/IEDM13553.2020.9372042, 4 pages.

Prasad et al., "Buried Power Rails and Back-side Power Grids: Arm® CPU Power Delivery Network Design Beyond 5nm", 4 pps., 978-1-7281-4032-2/19, © 2019 IEEE.

Salahuddin et al., "Buried power SRAM DTCO and system-level benchmarking in N3", 978-1-7281-6460-1/20, © 2020 IEEE, 2 pps.

Schuddinck et al., "Device-, Circuit- & Block-level evaluation of CFET in a 4 track library", 2019 Symposium on VLSI Technology Digest of Technical Papers, 978-4-86348-717-8, © 2019 JSAP, 2 pps.

"PCT Notification of Transmittal of the International Search Report and the Written Opinion of the International Searching Authority, or the Declaration", International Application No. PCT/EP2023/064810, International Filing Date Jun. 2, 2023, Date of mailing Sep. 5, 2023, 13 Pgs.

Gupta et al., "Buried Power Rail Metal exploration towards the 1 nm Node," 2021 IEEE International Electron Devices Meeting (IEDM), 2021, 4 Pgs, doi: 10.1109/IEDM19574.2021.9720684.

Mallik A. et al., Economics Of Semiconductor Scaling - A Cost Analysis For Advanced Technology Node, Symposium on VLSI Technology, Jun. 9-14, 2019, pp. T202-T203.

Moroz, et al., Can We Ever Get to a 100 nm Tall Library? Power Rail Design for 1nm Technology Node, IEEE Symposium on VLSI Technology, Jun. 16-19, 2020, pp. 1-2.

* cited by examiner

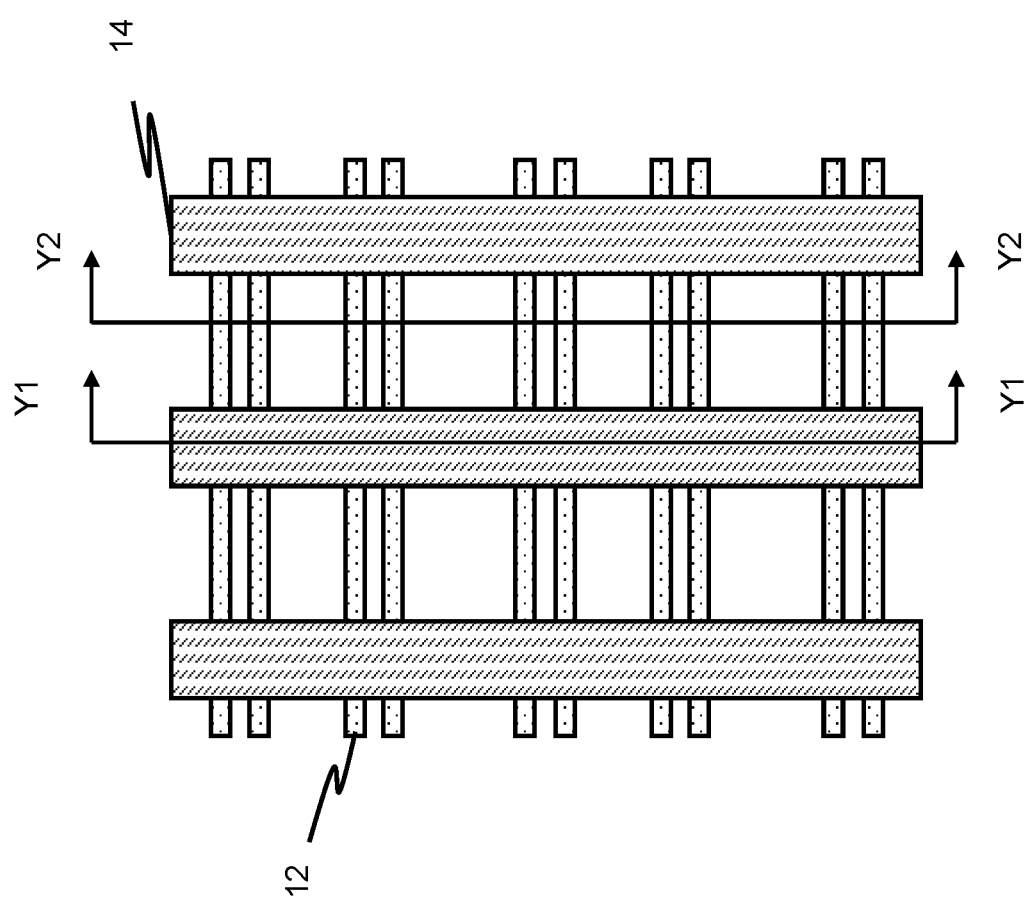

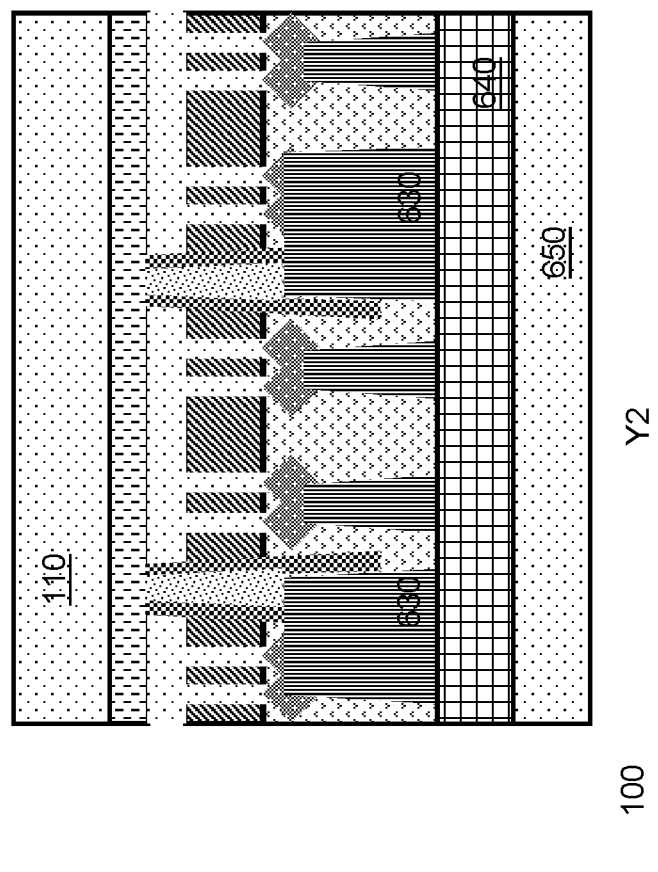
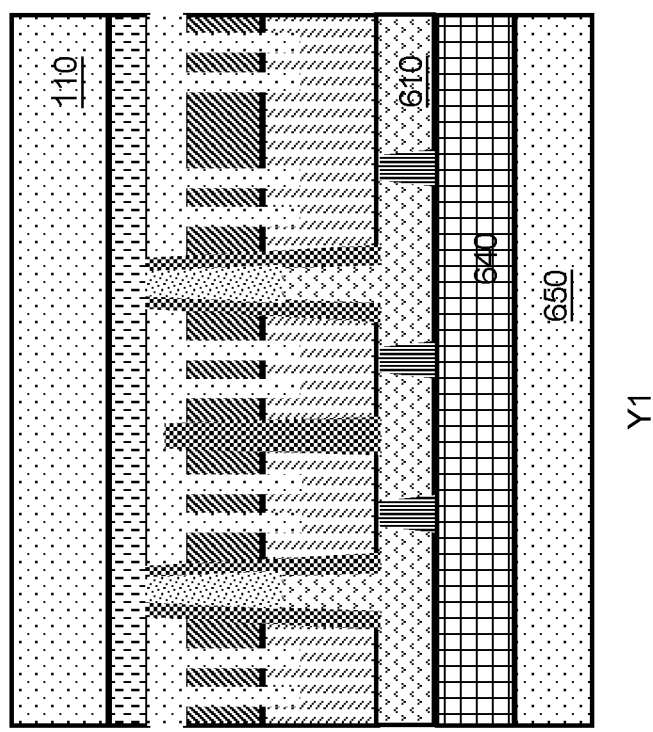
Fig. 7

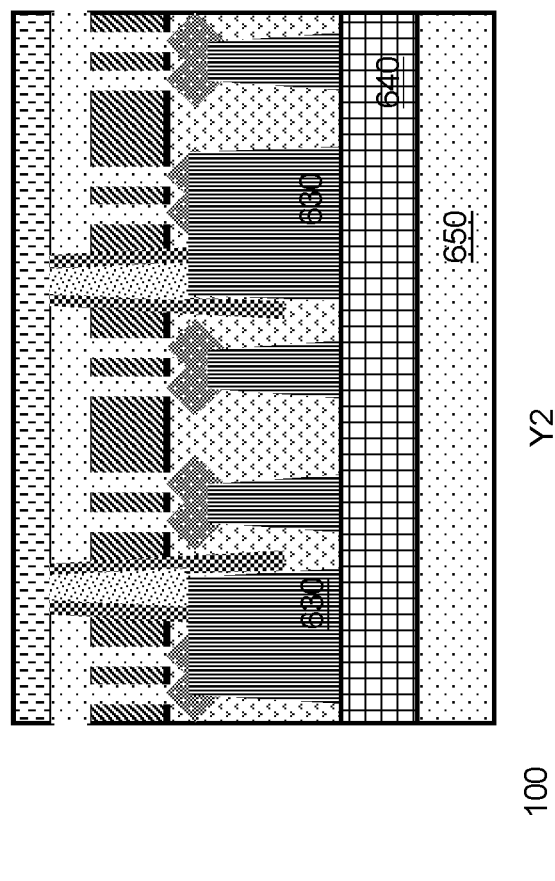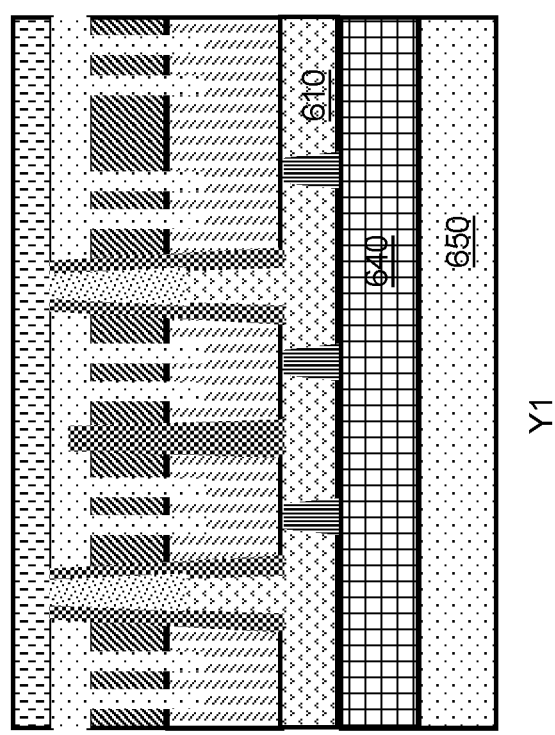
Fig. 8

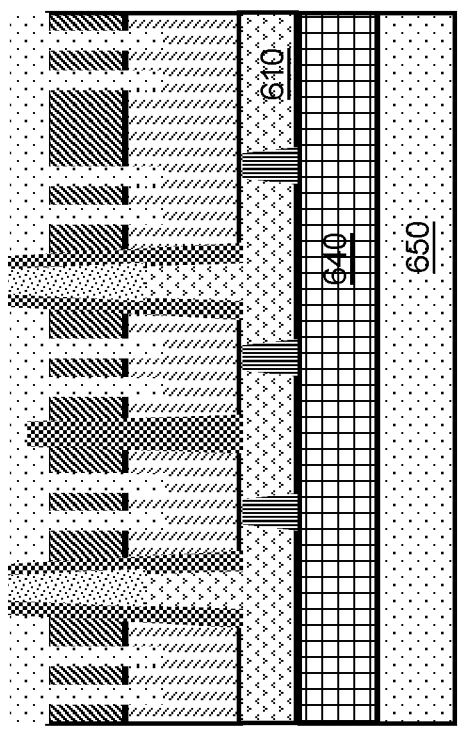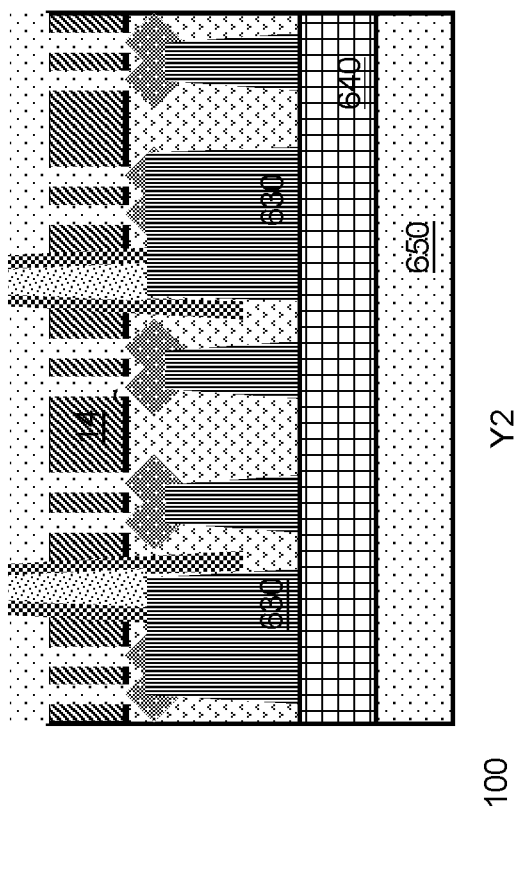
Fig. 9

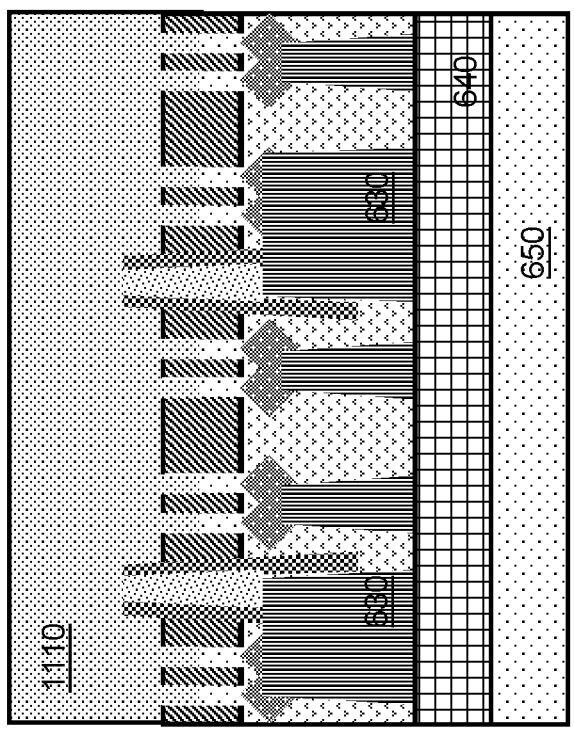
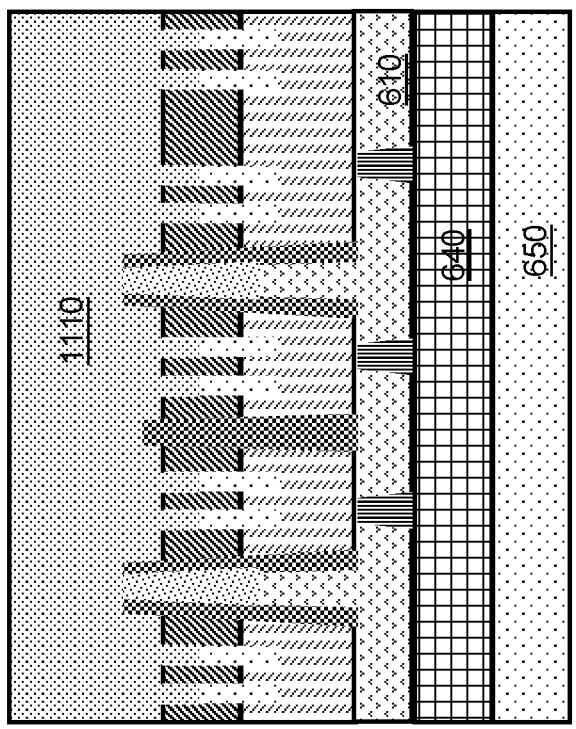
Fig. 11

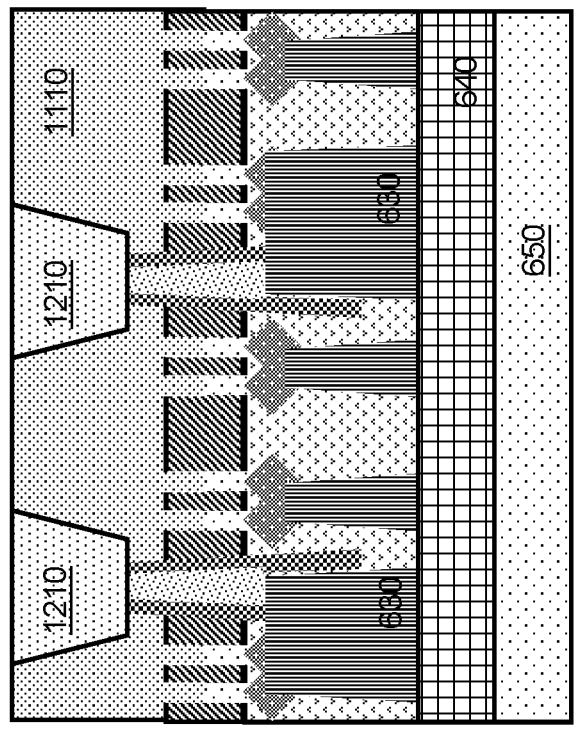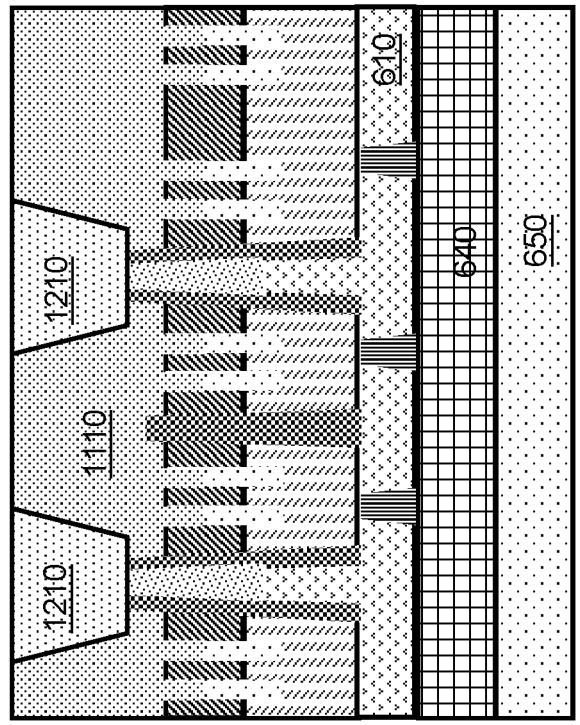
Fig. 12

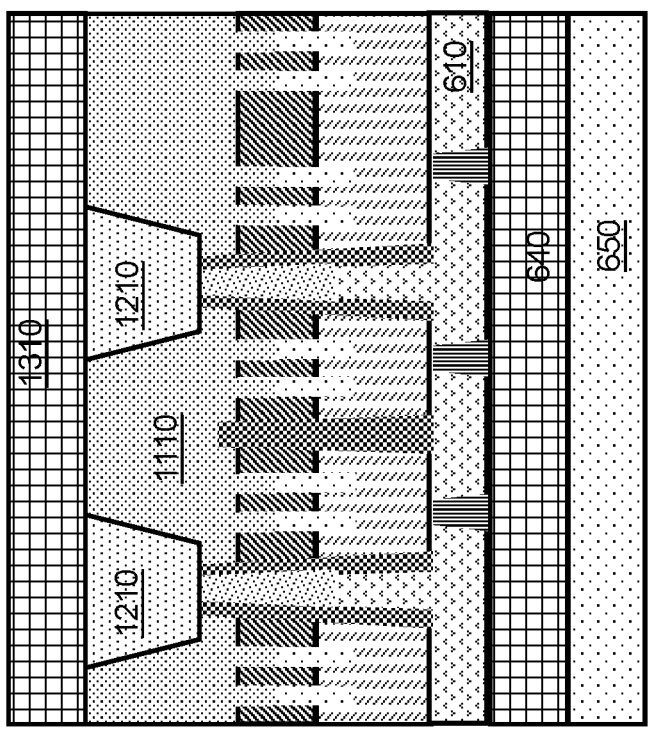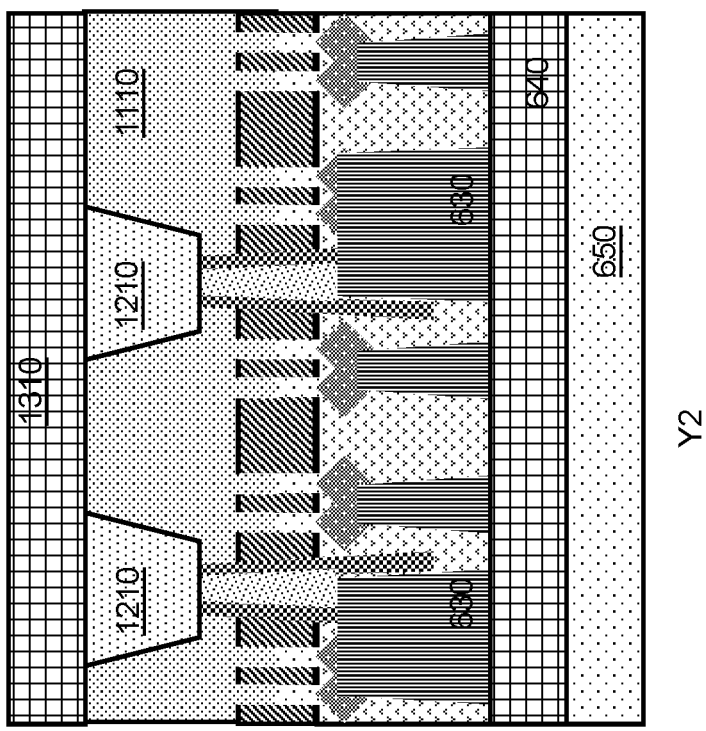
Fig. 13

SEMICONDUCTOR DEVICE HAVING A BACKSIDE POWER RAIL

BACKGROUND

The disclosure relates generally to semiconductor field effect transistor (FET) devices. The disclosure relates particularly to FET devices having a combined frontside buried power rail (or power bar) and backside power rail structures.

Semiconductor devices, such as field effect transistors, require a supportive power infrastructure to form the circuitry associated with the devices.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device includes a plurality of field effect transistors (FET) formed upon semiconductor fins. Each FET includes a gate disposed transversely upon a first portion of the fins of the FET, one or more source/drain regions disposed upon the fins and in contact with the gate, and an electrically isolating layer disposed adjacent to a second portion of the fins above the gate and the source/drain regions, the electrically isolating layer having an interface with the gate. The device further includes a buried power rail (BPR) disposed between otherwise adjacent FETs. The BPR includes a metal rail extending beyond the interface into the gate, and electrically isolating sidewalls separating the metal rail from the gate and the source/drain regions. The device also includes a via-buried power rail contact disposed adjacent to the electrically isolating sidewalls, in contact with the metal rail, and in contact with one source/drain region.

In one aspect, a semiconductor device includes a plurality of field effect transistors (FET) formed upon semiconductor fins. Each FET includes a gate disposed transversely upon a first portion of the fins of the FET, one or more source/drain regions disposed upon the fins and in contact with the gate, and an electrically isolating layer disposed adjacent to a second portion of the fins above the gate and the source/drain regions, the electrically isolating layer having an interface with the gate. The device further includes a buried power rail (BPR) disposed between otherwise adjacent FETs. The BPR includes a metal rail extending beyond the interface into the gate, and electrically isolating sidewalls separating the metal rail from the gate and the source/drain regions. The device also includes a common contact disposed adjacent to the electrically isolating sidewalls, in contact with the metal rail, and in contact with one source/drain region.

In one aspect, a semiconductor device includes a plurality of field effect transistors (FET) formed upon semiconductor fins, wherein each FET includes a gate disposed transversely upon a first portion of the fins of the FET, one or more source/drain regions disposed upon the fins and in contact with the gate, and an electrically isolating layer disposed adjacent to a second portion of the fins above the gate and the source/drain regions. The electrically isolating layer has a first interface with the gate and a second interface with a substrate. The device also includes a buried power rail (BPR) disposed between otherwise adjacent FETs, the BPR including a metal rail extending beyond the second interface into the substrate, and electrically isolating sidewalls separating the metal rail from the substrate and the electrically isolating layer. The device further includes a gate cut disposed above the buried power rail, the gate cut having dielectric sidewalls, and a metal element grown above and inContact with the metal rail. The device also includes a via-buried power rail contact disposed in contact with the metal element and in contact with one source/drain region.

In one aspect, a semiconductor device includes a plurality of field effect transistors (FET) formed upon semiconductor fins, wherein each FET includes a gate disposed transversely upon a first portion of the fins of the FET, one or more source/drain regions disposed upon the fins and in contact with the gate, and an electrically isolating layer disposed adjacent to a second portion of the fins above the gate and the source/drain regions. The electrically isolating layer has a first interface with the gate and a second interface with a substrate. The device also includes a buried power rail (BPR) disposed between otherwise adjacent FETs, the BPR including a metal rail extending beyond the second interface into the substrate, and electrically isolating sidewalls separating the metal rail from the substrate and the electrically isolating layer. The device further includes a gate cut disposed above the buried power rail, the gate cut having dielectric sidewalls, and a metal element grown above and inContact with the metal rail. The device also includes a common contact disposed in contact with the metal element and in contact with one source/drain region.

In one aspect, a method of fabricating a semiconductor device includes fabricating a plurality of FETs upon a wafer, forming a frontside buried power rail in a first gate cut between otherwise a first pair of otherwise adjacent FETs, inverting the wafer, and forming a backside power rail in contact with the frontside buried power rail.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

FIG. 1A provides a schematic plan view of a device, according to an embodiment of the invention. The figure illustrates the location of the section lines associated with the respective views of FIGS. 1B-24.

FIG. 7 provides cross-sectional views of a step in the fabrication of a semiconductor device, according to an embodiment of the invention. The figure illustrates the device after flipping the wafer.

FIG. 8 provides cross-sectional views of a step in the fabrication of a semiconductor device, according to an embodiment of the invention. The figure illustrates the device after removing the substrate.

FIG. 9 provides cross-sectional views of a step in the fabrication of a semiconductor device, according to an embodiment of the invention. The figure illustrates the device after etch-stop material layer removal.

FIG. 11 provides cross-sectional views of a step in the fabrication of a semiconductor device, according to an embodiment of the invention. The figure illustrates the device after deposition of a backside interlayer dielectric layer.

FIG. 12 provides cross-sectional views of a step in the fabrication of a semiconductor device, according to an embodiment of the invention. The figure illustrates the device after forming backside buried power rails in contact with the metal rails of the device.

FIG. 13 provides cross-sectional views of a step in the fabrication of a semiconductor device, according to an embodiment of the invention. The figure illustrates the device after formation of a backside power distribution network.

DETAILED DESCRIPTION

Figure 1B:
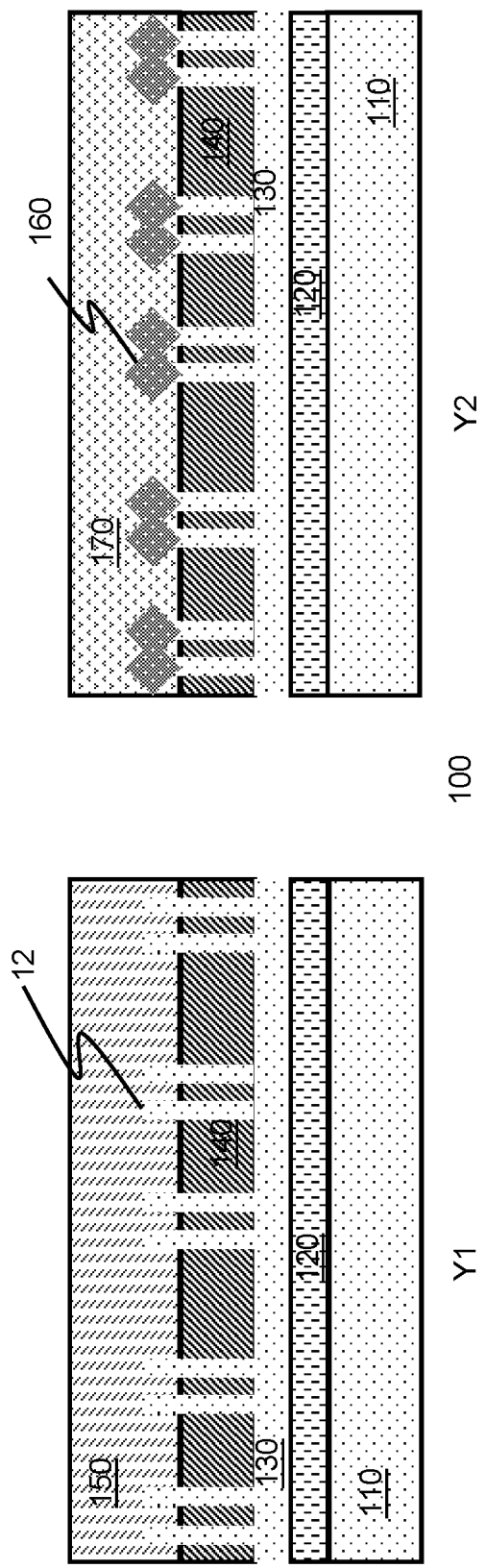
FIG. 1B provides cross-sectional views of a step in the fabrication of a semiconductor device, according to an embodiment of the invention. The figure illustrates the device following formation of high-k metal gate and epitaxially grown source-drain structures.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Semiconductor devices require electric connections to power sources to function. As devices scale to increasingly smaller dimensions, connecting the devices to power supplies becomes increasingly challenging. Via to the buried power rail (VBPR) connections, formed in etched vias extending through various layers of a device present the challenge of high aspect rations of height to width with large resistances and the possibility of short circuit connections to nearby device elements. Disclosed embodiments, provide device power rail connections having reduced electrical resistance and a reduced likelihood of device short circuits while enabling device dimension downscaling. Embodiments include forming a hybrid power rail structure by firstly forming a frontside buried power rails (or power bars) in the gate cut regions in between N2N or P2P device spaces, flipping the wafer and then forming backside power rail connections to the frontside buried power rails (or power bars). In an embodiment, after forming a buried power rail having a top surface below the top surface of an adjacent shallow trench isolation layer region, embodiment methods include forming gate cuts above the BPR and selectively growing metal layers above and in contact with the BPR elements.

Reference is now made to the figures. The figures provide schematic cross-sectional illustration of semiconductor devices at intermediate stages of fabrication, according to one or more embodiments of the invention. The figures provide cross-sectional views indicated by section lines Y1 and Y2 of FIG. 1A. The figures provide schematic representations of the devices of the invention and are not to be considered accurate or limiting with regards to device element scale.

FIG. 1A provides a plan view of a semiconductor device including n-type field effect transistors (NFET) and p-type field effect transistors (PFET). The NFET and PFET devices alternate in a pattern such as PFET-NFET, NFET-PFET, PFET. . . . The Figure illustrates device fins 12, and device gates 14 for the formation of hybrid power rails to connect the individual devices to system power supplies.

FIG. 1B illustrates device 100 after fabrication steps including the formation of an etch stop layer 120 upon an underlying substrate 110, the formation of a second substrate layer 130 and the etching of device fins 12 from substrate layer 130, the deposition of shallow trench isolation layer 140 to electrically separate otherwise adjacent fin FET devices, the formation of high-k metal gate 150 replacing a placeholding dummy gate (not shown), and the formation of epitaxially grown source-drain (S/D) regions 160 between gate structures 150, and the deposition and chemical-mechanical planarization (CMP) of interlayer dielectric layer 170 above and around the S/D regions 160.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 160 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

In an embodiment, etch stop layer 120 comprises a buried oxide layer material such as $SiO_2$, or a SiGe layer, or equivalent selectively etchable materials. In an embodiment, etch stop layer 120 comprises a thickness of between about 5 nanometers (nm) and about 500 nm.

Second substrate 130 comprises a material similar to that of bottom substrate 110. Etching of the second substrate 130 yields device fins 12. Deposition of shallow trench isolation (STI) layer 140, such as silicon dioxide, or any suitable combination of multiple dielectric materials (e.g., silicon nitride and silicon oxide between otherwise adjacent fins 12 provides electrical separation between otherwise adjacent FET devices.

FIG. 1B illustrates the device following deposition, and planarization of a interlayer dielectric (ILD) 170, above and around S/D regions 160, ILD 170 comprises any suitable dielectric material, for example $Si_3N_4$, SiBCN, SiNC, SiN, SiCO, $SiO_2$, SiNOC, etc. This can be achieved by a conformal deposition of ILD 170 to pinch-off the gate-to-gate space or just overfill the sacrificial spacer material followed by a chemical mechanical planarization (CMP) to a desired upper surface height for the ILD 170. After that, dummy gates are removed, and HKMG 150, has been formed in the void space created by removal of a dummy gate material. Gate structure 150 includes gate dielectric and gate metal layers. The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gates can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a CMP process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). The term work function metal includes a single metal layer as well as a stack of metal layers, or surface dipoles combined with a single or stack of metal layers. After formation and CMP of the HKMG, the HKMG can be optionally recessed followed by a deposition and CMP of a gate cap dielectric material (not shown), such as SiN, or similar materials, completing the replacement metal gate fabrication stage for the device.

Figure 2:
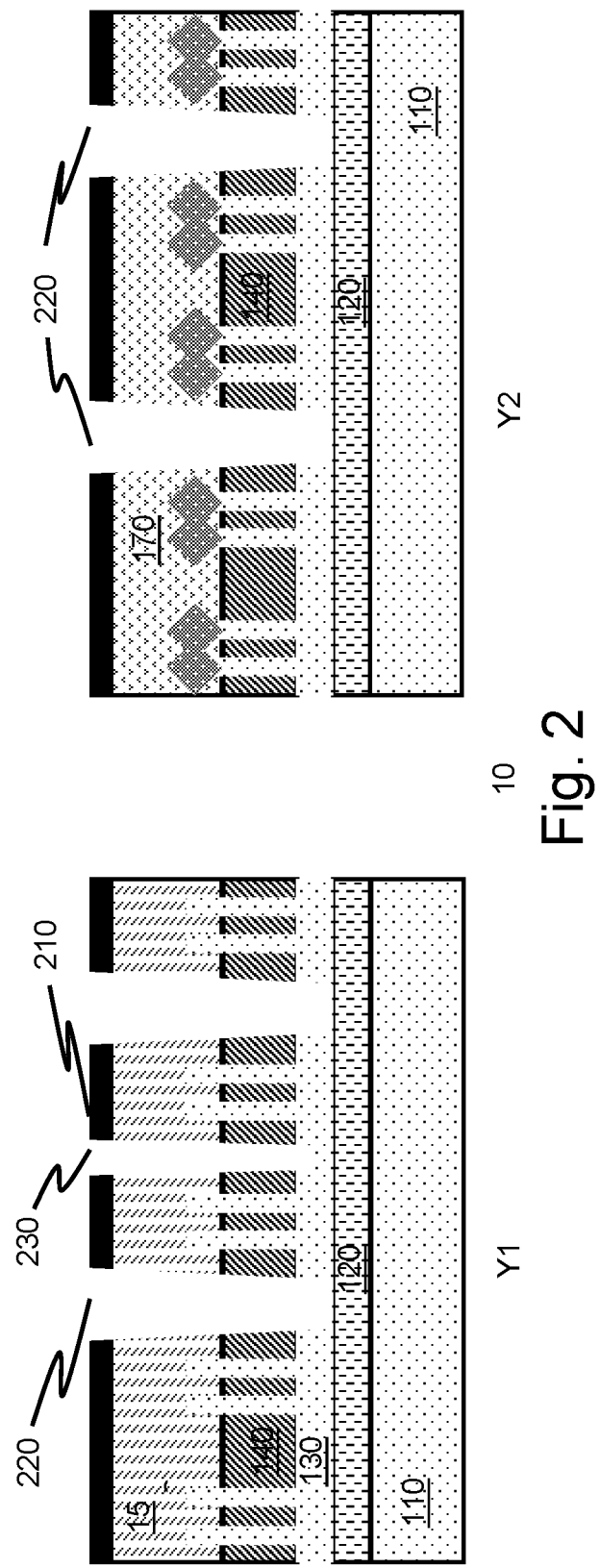
FIG. 2 provides cross-sectional views of a step in the fabrication of a semiconductor device, according to an embodiment of the invention. The figure illustrates the device after the formation of gate cuts for buried power rails.

FIG. 2 illustrates device 100 following the deposition of a patterning hardmask 210, and patterning and selective etching of a set of gate cuts 220, 230 through hardmask 210, HKMG 150, ILD 170, and STI 140, to etch stop layer 120 for the gate cuts disposed between otherwise adjacent similar devices (e.g., gate cuts 220 between similar devices pfet-pfet, or nfet-nfet) and etched to a point in second substrate 130 when disposed between dissimilar devices (gate cuts 230 between otherwise adjacent nfet-pfet devices) Gate cuts 220, 230, may be formed using exemplary etching techniques described above. Gate cuts 230 have a smaller horizontal cross-section. In an embodiment, gate cuts 230 have a cut width of between about 10 nm and about 25 nm while gate cuts 220 have a cut width of between about 20 nm and about 40 nm.

In an embodiment, the hardmask includes a nitride, oxide, an oxide-nitride bilayer, or another suitable material such as TiN, TiOx, AlN, etc. In some embodiments, the hardmask may include an oxide such as silicon oxide (SiO), a nitride such as silicon nitride (SiN), an oxynitride such as silicon oxynitride (SiON), combinations thereof, etc. In some embodiments, the hardmask is a silicon nitride such as $Si_3N_4$.

Figure 3:
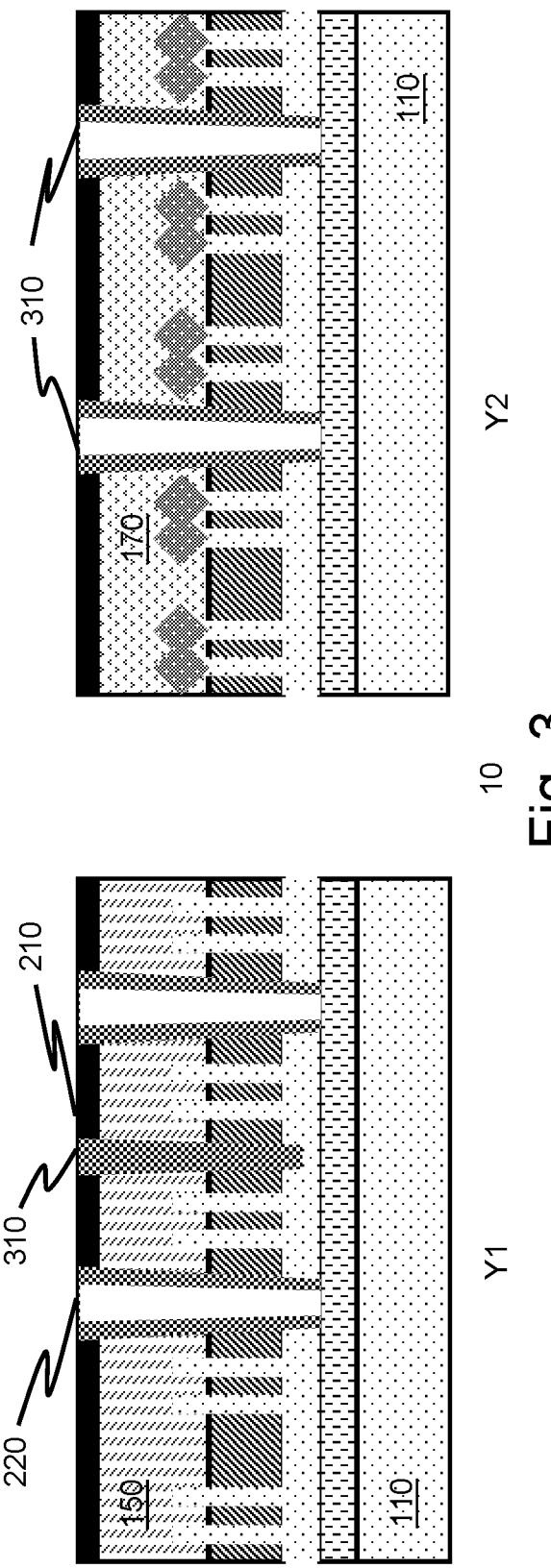
FIG. 3 provides cross-sectional views of a step in the fabrication of a semiconductor device, according to an embodiment of the invention. The figure illustrates the device after the formation of dielectric spacers within the gate cuts.

FIG. 3 illustrates device 100 following deposition of dielectric spacer 310 in gate cuts 220 and 230. As shown in the FIGURE, dielectric spacer 310 completely fills narrower gate cuts 230 while forming sidewall spacers 310 upon the walls of gate cuts 220. In an embodiment, dielectric spacer 310 may be the same material as hardmask or may be different materials and may be comprised of any one or more of a variety of different insulative materials, such as $Si_3N_4$, SiBCN, SiNC, SiN, SiCO, $SiO_2$, SiNOC, etc.

Figure 4:
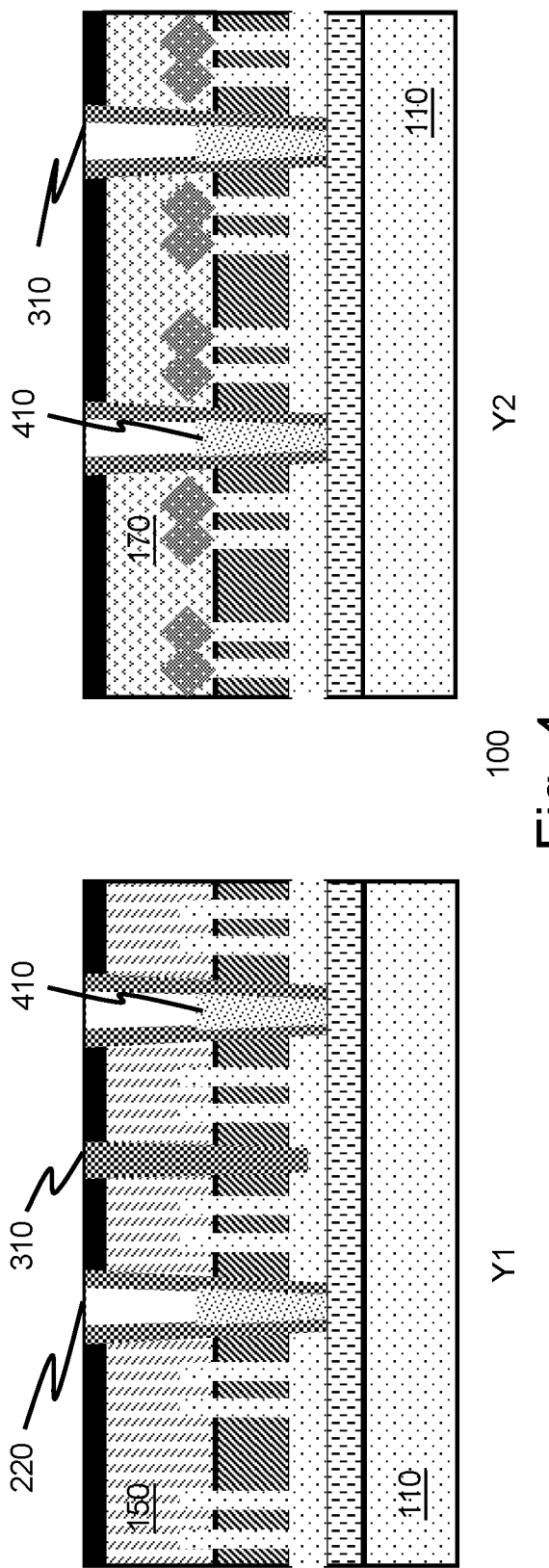
FIG. 4 provides cross-sectional views, of a step in the fabrication of a semiconductor device, according to an embodiment of the invention. The figure illustrates the device after the formation of BPR metal rails in gate cuts.
Figure 5:
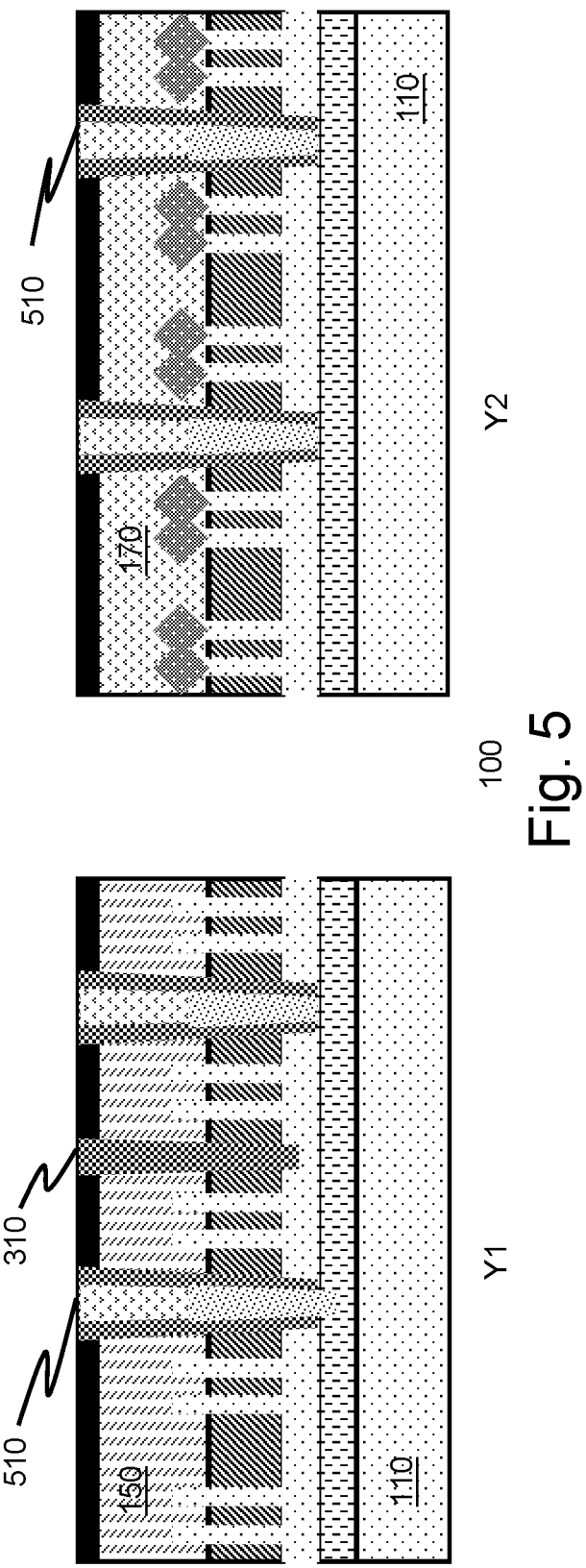
FIG. 5 provides cross-sectional views of a step in the fabrication of a semiconductor device, according to an embodiment of the invention. The figure illustrates the device after filling the gate cuts with an interlayer dielectric material.

FIG. 4 illustrates device 100 following deposition of frontside buried metal rails 410 in wide gate cuts 220. In an embodiment, buried metal rails 410 comprises a material such as W, Ru, or Co, with an adhesion metal liner such as TiN. Recessing frontside buried metal rails 410 follows deposition of the metal rail 410 material. Recessing metal rails 410 yields final rails extending above STI materials 140 and having some overlap with HKMG materials 150. Relatively small overlapping between metal rails 410 and HKMG 150 yields little if any parasitic capacitance from the metal rails 410. In an embodiment, a patterning process (including litho and etch processes) removes unwanted metal rails 410 in some trenches, forming frontside buried power bars. FIG. 5 illustrates device 100 following deposition and CMP of addition ILD materials 510, filling the remaining spaces of gate cuts 220, above metal rails 410.

Figure 6A:
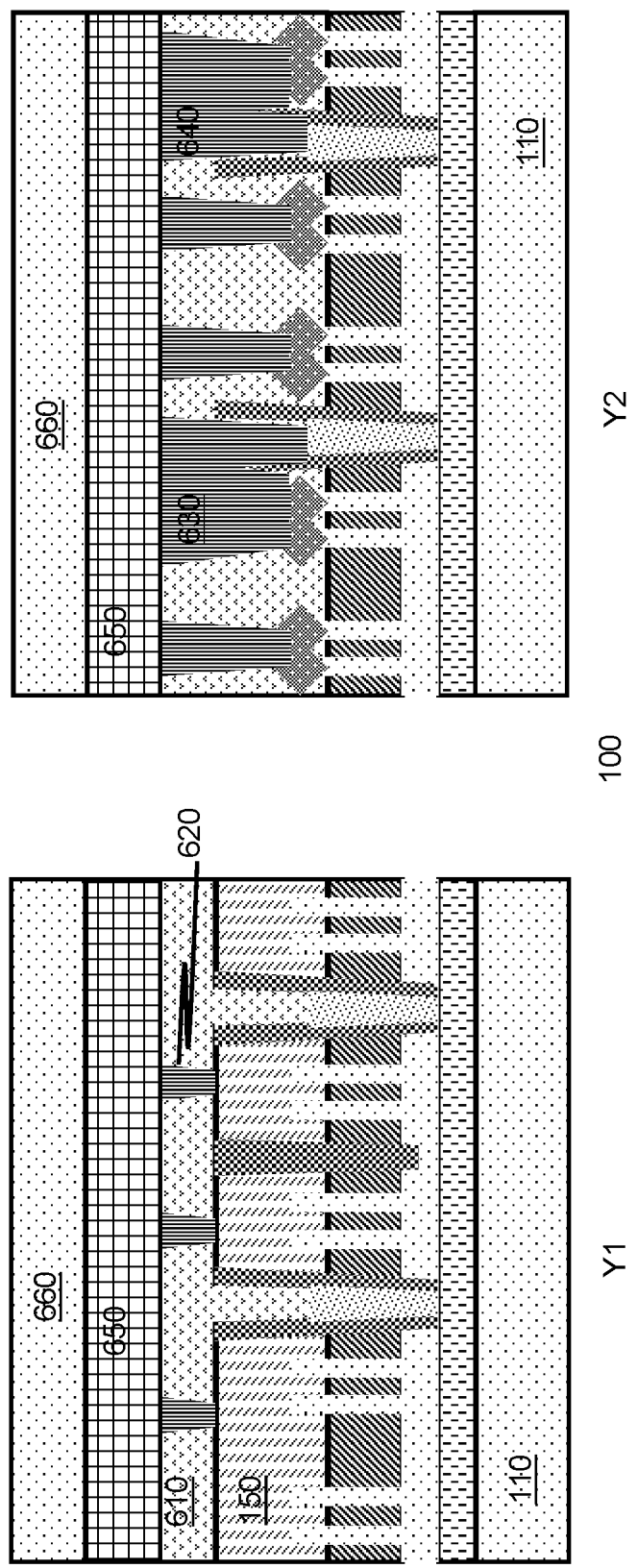
FIG. 6A provides cross-sectional views of a step in the fabrication of a semiconductor device, according to an embodiment of the invention. The figure illustrates the device after middle of line contact formation, back-end-of-line structure formation and formation of a carrier wafer.

FIG. 6A illustrates device 100 following deposition of additional ILD layer 610, as well as formation of middle-of-line gate contacts 620, S/D contacts 630, and via-to buried power rail (VBPR) contacts 640. In an embodiment, formation of contacts 620, 630, and VBPR contact 640, comprises a trench metal deposition process which yields a metallized layer adjacent to and above the S-D regions 160, and HKMG region 150. In an exemplary embodiment, formation of the trench metallized layer includes forming a silicide layer between contact and epitaxial grown S/D regions 160, (e.g., Ni silicide, Ti silicide, NiPt silicide, Co silicide, etc.) followed by forming metallization materials above the silicide (e.g., a thin adhesion metal such as TiN and a bulk metal fill such as Co, W, Ru, etc., followed by CMP. FIG. 6A further illustrates a generalized back-end-of-line (BEOL) interconnect structure 650, and a carrier wafer substrate structure 660 bonded to the BEOL structure.

Figure 6B:
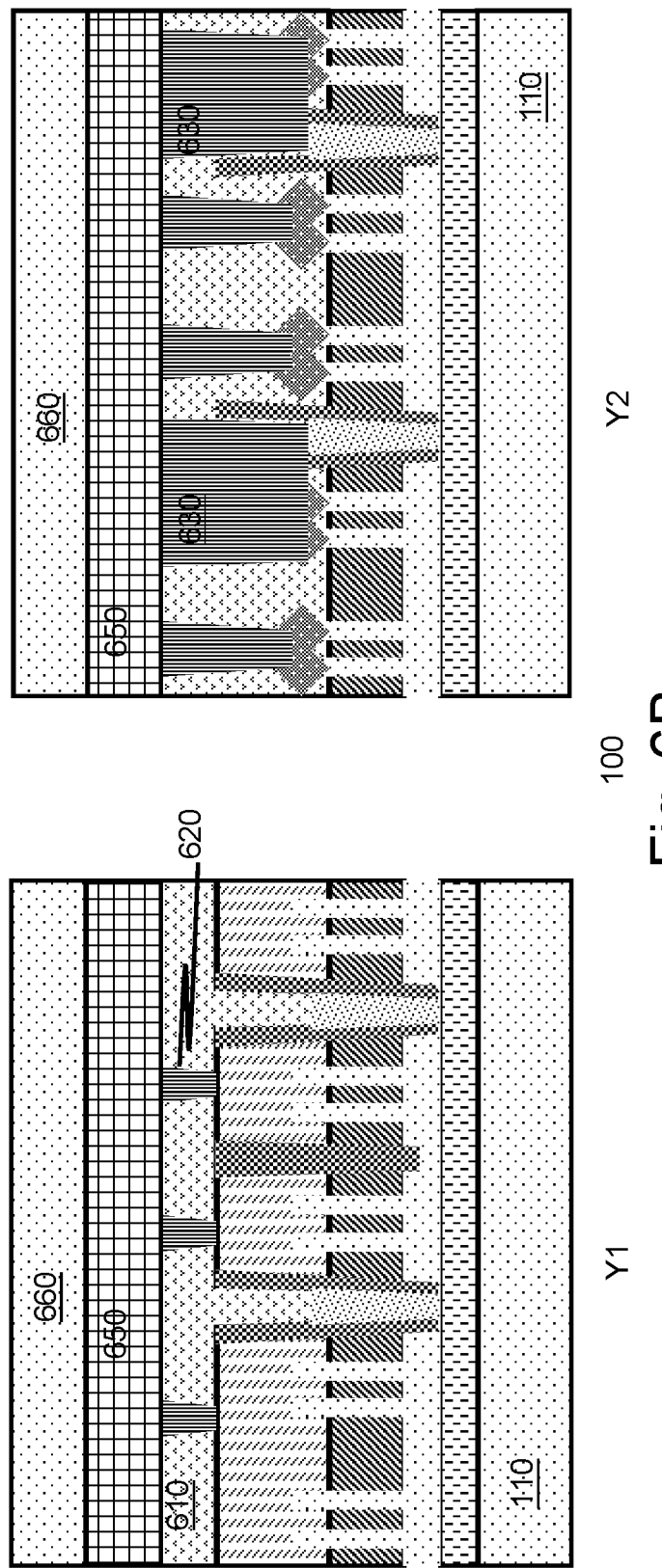
FIG. 6B provides cross-sectional views of a step in the fabrication of a semiconductor device, according to an embodiment of the invention. The figure illustrates the device after middle of line contact formation, back-end-of-line structure formation and formation of a carrier wafer. The figure illustrates an embodiment having a common contact for the source-drain regions and the metal rails, rather than a source-drain contact and a via power rail contact.

FIG. 6B illustrates device 100 following deposition of additional ILD layer 610, as well as formation of middle-of-line gate contacts 620, and common S/D and BPR contacts 630. In an embodiment, formation of contacts 620, and 630, comprises a trench metal deposition process which yields a metallized layer adjacent to and above the S-D regions 160, and HKMG region 150. In an exemplary embodiment, formation of the trench metallized layer includes forming a silicide layer between contact and epitaxial grown S/D regions 160, (e.g., Ni silicide, Ti silicide, NiPt silicide, Co silicide, etc.) followed by forming metallization materials above the silicide (e.g., a thin adhesion metal such as TiN and a bulk metal fill such as Co, W, Ru, etc., followed by CMP. FIG. 6A further illustrates a generalized back-end-of-line (BEOL) interconnect structure 650, and a carrier wafer substrate structure 660 bonded to the BEOL structure. Forming common S/D and BPR contacts 630 eliminates the masking, etching, and deposition steps associated with forming the VBPR contacts, resulting in saving of time and process resources.

FIG. 7 illustrates device 100 following flipping the wafer, resulting in access to bottom substrate 110 for further fabrication processing. FIG. 8 illustrates device 100 following selective etching to remove substrate 110, stopping at the surface of etch stop layer 120.

Figure 10:
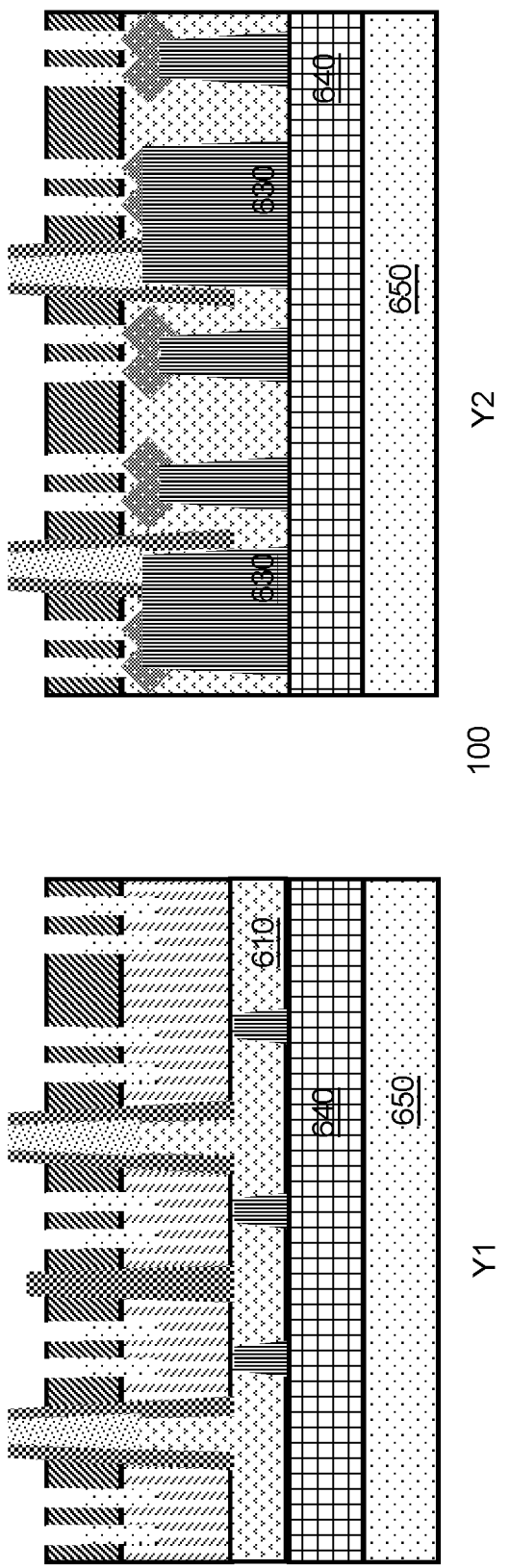
FIG. 10 provides cross-sectional views of a step in the fabrication of a semiconductor device, according to an embodiment of the invention. The figure illustrates the device after recessing the backside substrate material.

FIG. 9 illustrates device 100 following selective etching to remove etch stop layer 120, thereby exposing second substrates 130 as well surfaces of frontside buried power rail (or power bar) 410. FIG. 10 illustrates device 100 following recessing the material of substrate 130 into STI 140, exposing dielectric spacers 310. FIG. 11 illustrates device 100 following deposition and CMP of additional ILD layer 1110 above the frontside buried power rail (or power bar) 410 and between STI portions 140 around fins 12.

FIG. 12 illustrates device 100 following the patterning, etching and filling of trenches through ILD 1110, for the backside power rail 1210 in contact with frontside buried power rail (or power bar) 410. In an embodiment, backside power rail 1210 comprise materials including conductive metals such as W, Co, Ru, Cu, with a thin metal adhesion liner, such as TiN, TiN etc., etc.

FIG. 13 illustrates device 100 following formation of a generalized backside power distribution network (BSPDN) 1310 of connections to backside power rail 1210. In an embodiment, additional fabrication steps connect the BSPDN to additional device components including external device contacts and provide protective external device packaging (not shown).

Figure 14:
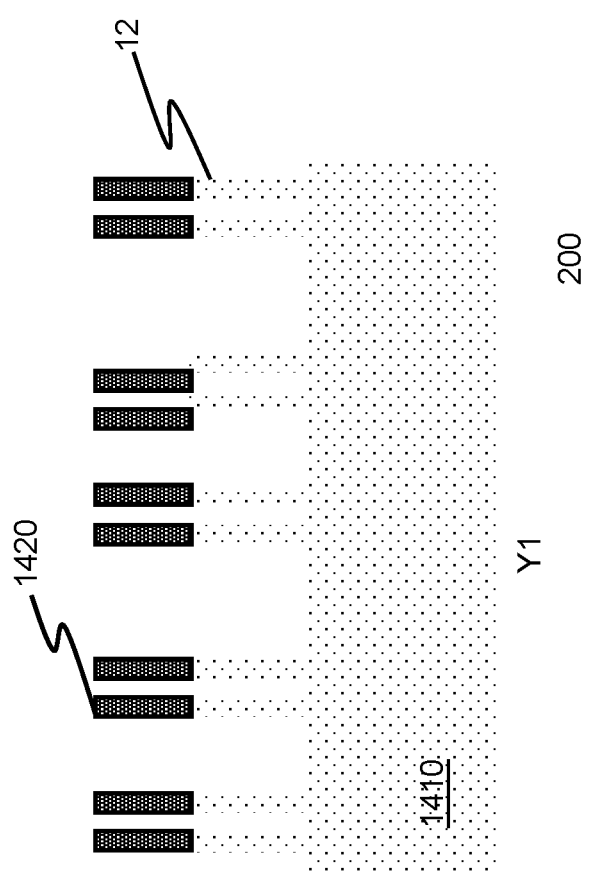
FIG. 14 provides a cross-sectional view of a step in the fabrication of a semiconductor device, according to an embodiment of the invention. The figure illustrates the device after formation of device fins.
Figure 15:
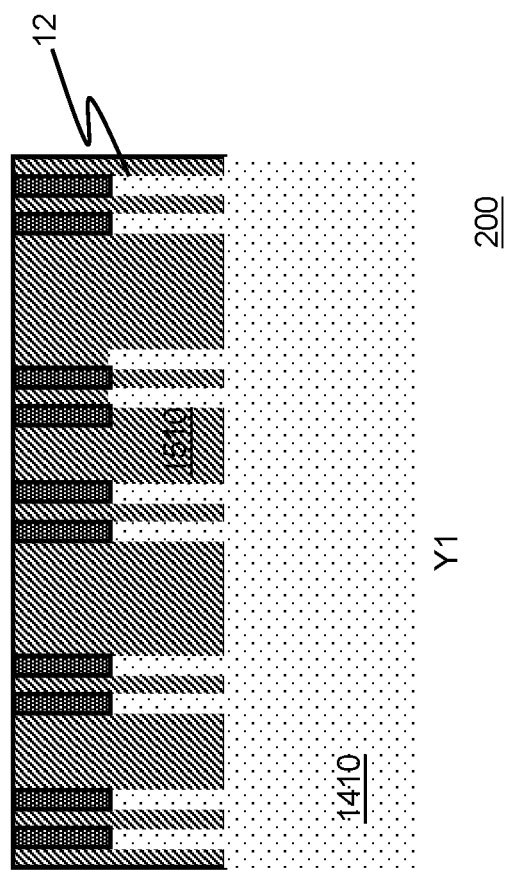
FIG. 15 provides a cross-sectional view of a step in the fabrication of a semiconductor device, according to an embodiment of the invention. The figure illustrates the device after deposition of an ILD layer and formation of a BPR gate cut.
Figure 16:
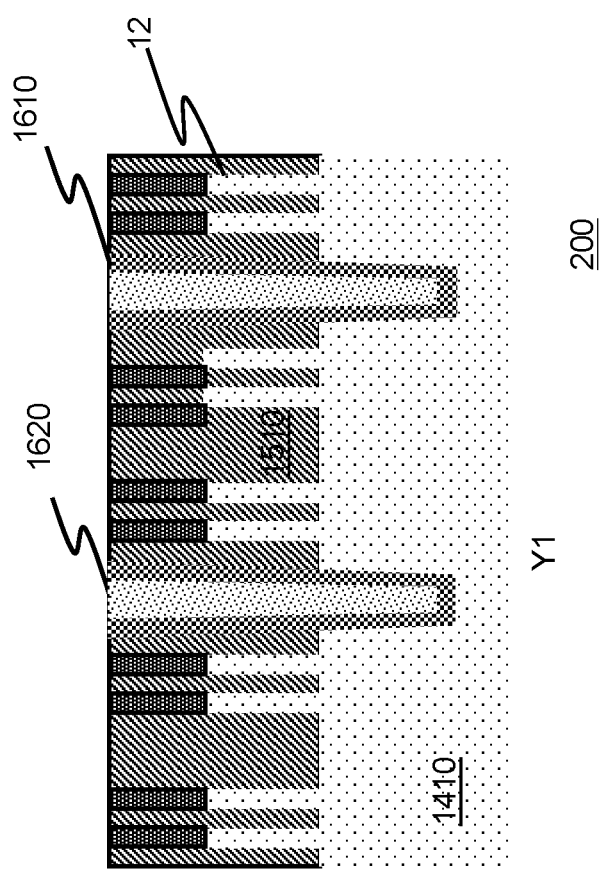
FIG. 16 provides a cross-sectional view of a step in the fabrication of a semiconductor device, according to an embodiment of the invention. The figure illustrates the device after formation of a dielectric spacer and a metal rail.
Figure 17:
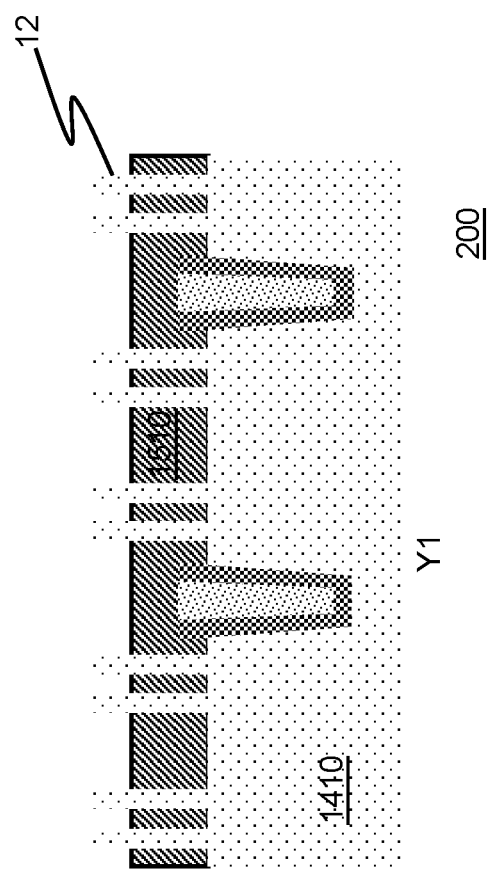
FIG. 17 provides a cross-sectional view of a step in the fabrication of a semiconductor device, according to an embodiment of the invention. The figure illustrates the device after recessing the BPR rail and etching the ILD material to reveal the fins.

FIG. 14 illustrates device 200 following formation of fins 12 from substrate 1410 capped with hardmask 1420 (an etch stop layer exist in substrate 1410 (not shown here). Figure illustrates device 200 following deposition of STI 1510 between fins 12. FIG. 16 illustrates device after patterning power rail trenches, followed by deposition of dielectric sidewalls 1610, similar to dielectric material 310, described above with respect to FIG. 3, and metal rail 1620, similar to metal rail 410, described above with respect to FIG. 4. FIG. 17 illustrates device 200 following recessing of the frontside power rail (or power bar) 1620, additional STI oxide fill and CMP, and recessing the STI material 1510 and removal of remaining hardmask material 1420. As shown in the Figure, deposition and CMP of additional STI material 1510 follows the recessing of the dielectric spacers 1610 and metal rails 1620.

Figure 18:
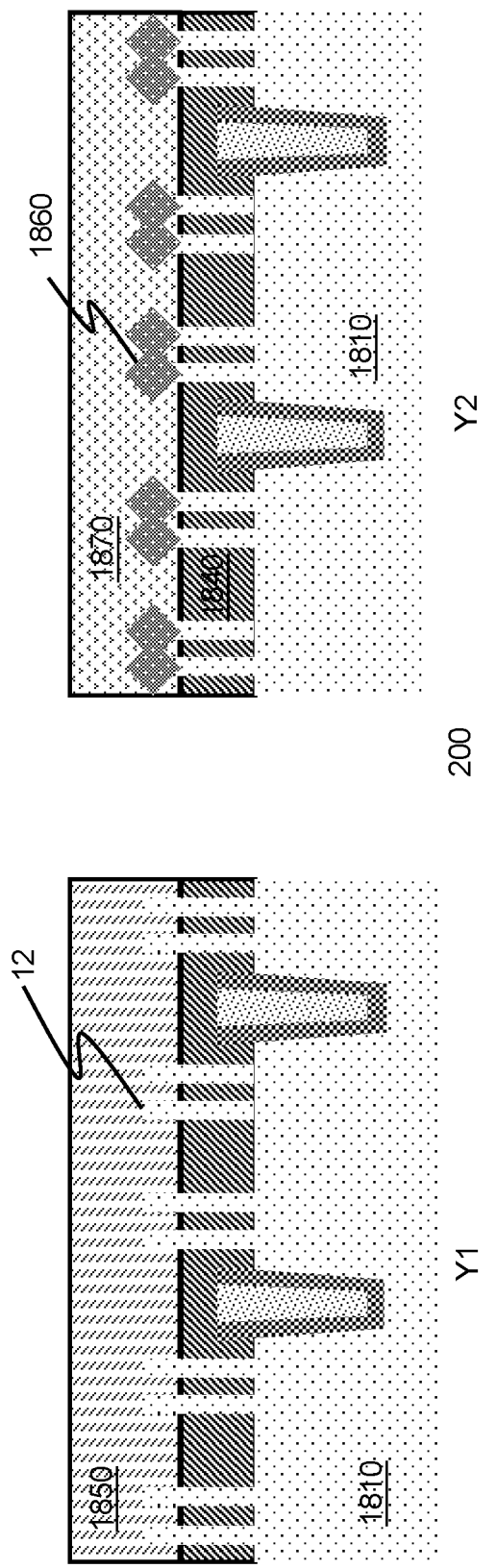
FIG. 18 provides cross-sectional views of a step in the fabrication of a semiconductor device, according to an embodiment of the invention. The figure illustrates the device following formation of high-k metal gate and epitaxially grown source-drain structures.

FIG. 18 illustrates device 200 after fabrication steps including the formation of the dummy gate and spacer (not shown), and the formation of epitaxially grown source-drain (S/D) regions 1860 between the dummy gate/spacers (not shown), and the deposition and chemical-mechanical planarization (CMP) of interlayer dielectric layer 1870 above and around the S/D regions 1860, removal of the dummy gates, followed by the formation of high-k metal gate 1850 replacing a placeholding dummy gate (not shown).

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 160 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

The semiconductor substrate 1410 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

FIG. 18 illustrates the device following deposition, and planarization of a interlayer dielectric (ILD) 1870, above and around S/D regions 1860, ILD 1870 composed of any suitable dielectric material, for example $Si_3N_4$, SiBCN, SiNC, SiN, SiCO, $SiO_2$, SiNOC, etc. This can be achieved by a conformal deposition of ILD 1870 to pinch-off the gate-to-gate space or just overfill the sacrificial spacer material followed by a chemical mechanical planarization (CMP) to a desired upper surface height for the ILD 1870. After that, HKMG 1850, has been formed in the void space created by removal of a dummy gate spacer material. Gate structure 150 includes gate dielectric and gate metal layers. The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gates can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a CMP process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). The term work function metal includes a single metal layer as well as a stack of metal layers, or surface dipoles combined with a single or stack of metal layers. After formation and CMP of the HKMG, the HKMG can be optionally recessed followed by a deposition and CMP of a gate cap dielectric material (not shown), such as SiN, or similar materials, completing the replacement metal gate fabrication stage for the device.

Figure 19:
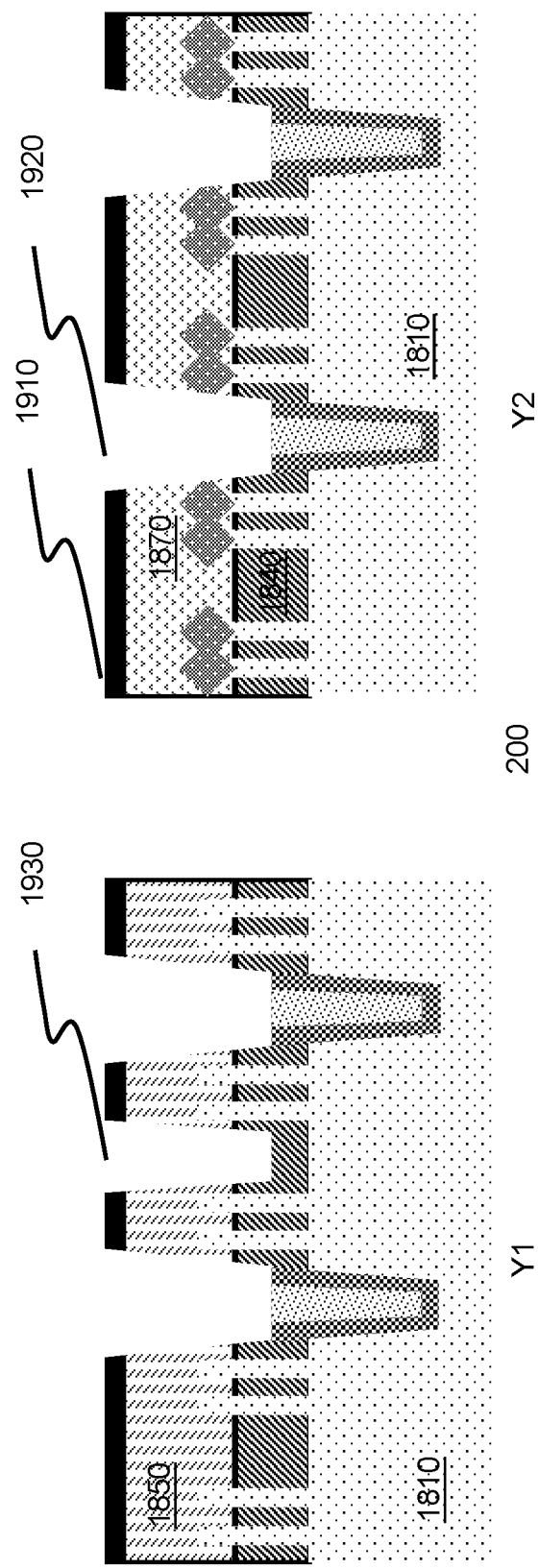
FIG. 19 provides cross-sectional views of a step in the fabrication of a semiconductor device, according to an embodiment of the invention. The figure illustrates the device after the formation of gate cuts above buried power rails.

FIG. 19 illustrates device 200 following the deposition of a patterning hardmask 1910, and patterning and selective etching of a set of gate cuts 1920, 1930 through hardmask 1910, HKMG 1850, ILD 1870, and STI 1510, metal rails 1610 for the gate cuts disposed between otherwise adjacent similar devices (e.g., gate cuts 1920 between similar devices pfet-pfet, or nfet-nfet) and etched to a point in STI 1510 when disposed between dissimilar devices (gate cuts 1930 between otherwise adjacent nfet-pfet devices) Gate cuts 1920, 1930, may be formed using exemplary etching techniques described above. Gate cuts 1930 have a smaller horizontal cross-section.

In an embodiment, the hardmask includes a nitride, oxide, an oxide-nitride bilayer, or another suitable material such as TiN, TiOx, AlN, etc. In some embodiments, the hardmask may include an oxide such as silicon oxide (SiO), a nitride such as silicon nitride (SiN), an oxynitride such as silicon oxynitride (SiON), combinations thereof, etc. In some embodiments, the hardmask is a silicon nitride such as $Si_3N_4$.

Figure 20:
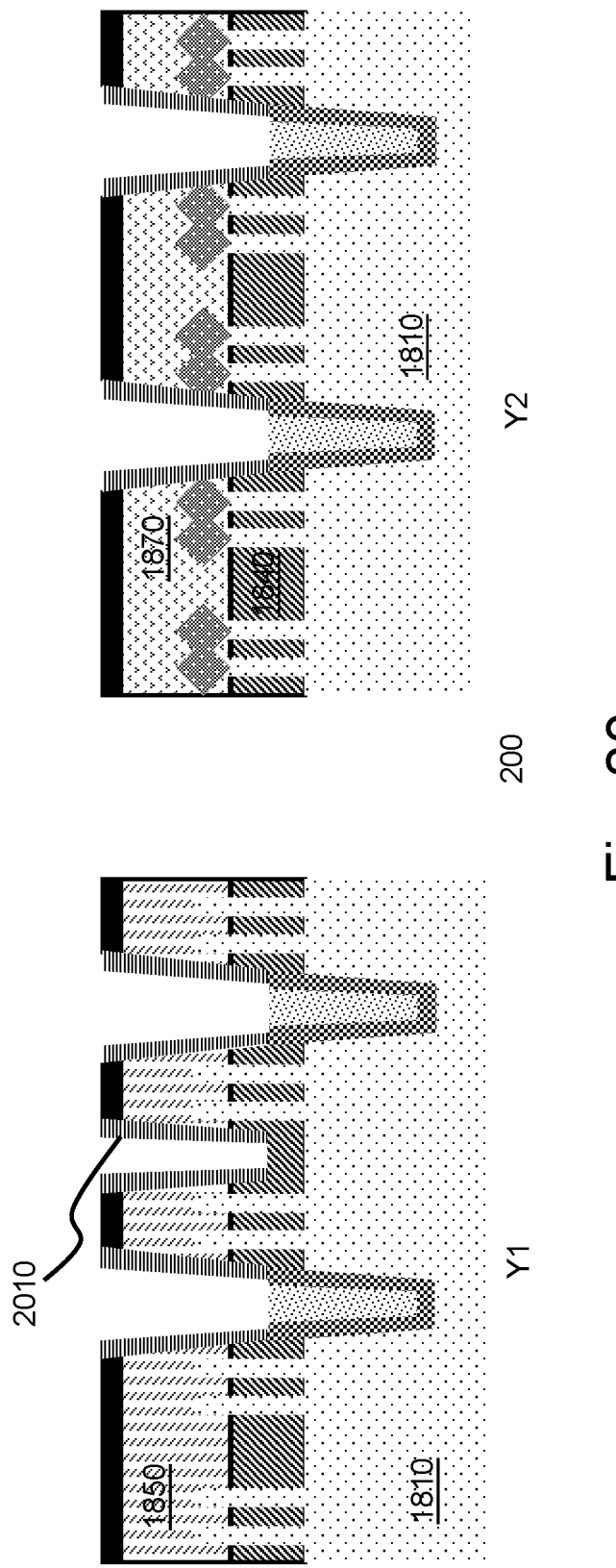
FIG. 20 provides cross-sectional views of a step in the fabrication of a semiconductor device, according to an embodiment of the invention. The figure illustrates the device after the formation of dielectric spacers within the gate cuts.

FIG. 20 illustrates device 200 following deposition of dielectric spacer 2010 in gate cuts 1920 and 1930. In an embodiment, dielectric spacer 2010 may be the same material as hardmask or may be different materials and may be comprised of any one or more of a variety of different insulative materials, such as $Si_3N_4$, SiBCN, SiNC, SiN, SiCO, $SiO_2$, SiNOC, etc.

Figure 21:
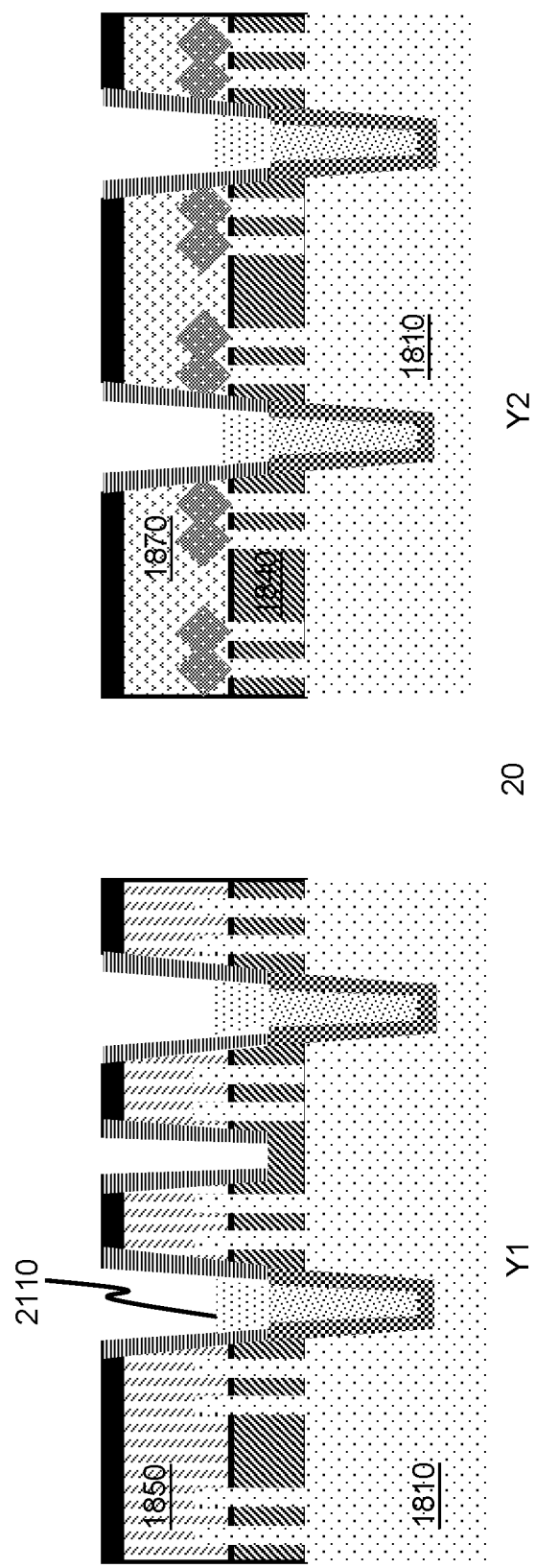
FIG. 21 provides cross-sectional views of a step in the fabrication of a semiconductor device, according to an embodiment of the invention. The figure illustrates the device after the formation of selective metal growth above metal rails in gate cuts.

FIG. 21 illustrates device 200 following deposition of selective metal growth 2110 above metal rails 1610 in wide gate cuts 1920. In an embodiment, selective metal growth 2110 comprises a material such as Co, W, or Ru. No metal growth occurs in gate cut 1930 as there is no metal rail 1610 exposed in such gate cuts to facilitate the metal growth during the metal deposition phase of the step.

Figure 22:
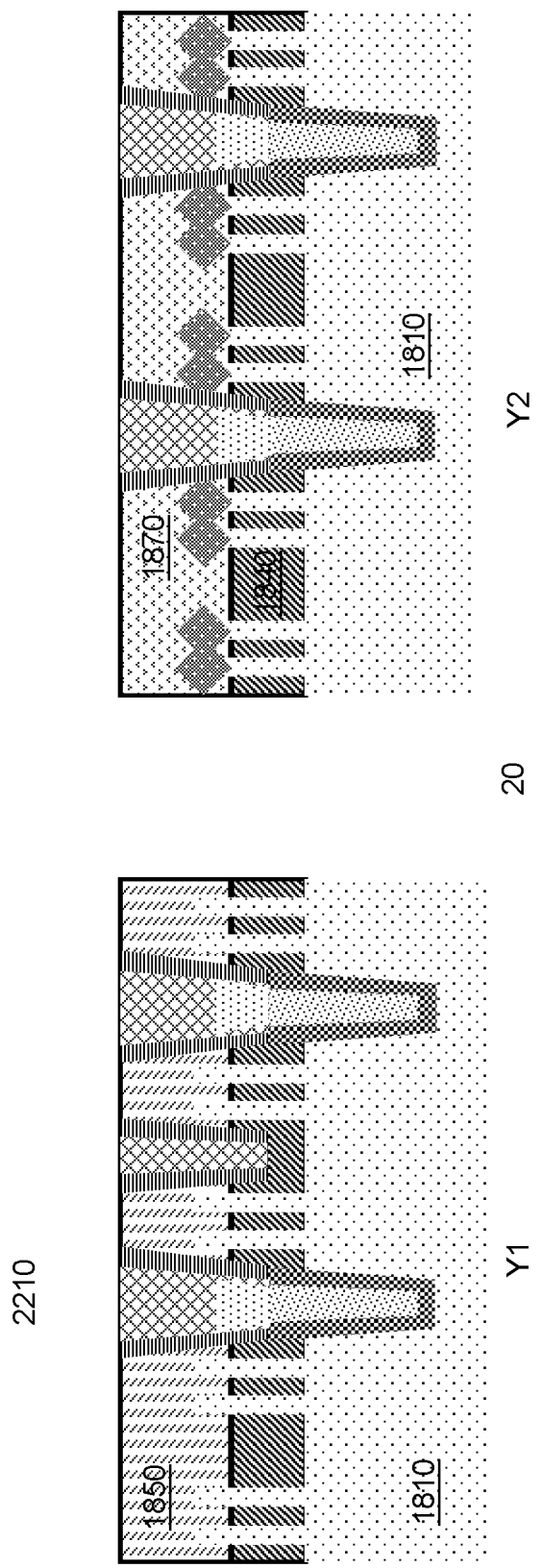
FIG. 22 provides cross-sectional views of a step in the fabrication of a semiconductor device, according to an embodiment of the invention. The figure illustrates the device after filling the gate cuts with a dielectric material.

FIG. 22 illustrates device 200 following deposition and CMP of additional dielectric materials 2210, similar to dielectric materials 170 described above, in gate cutes 1920 and 1930.

Figure 23:
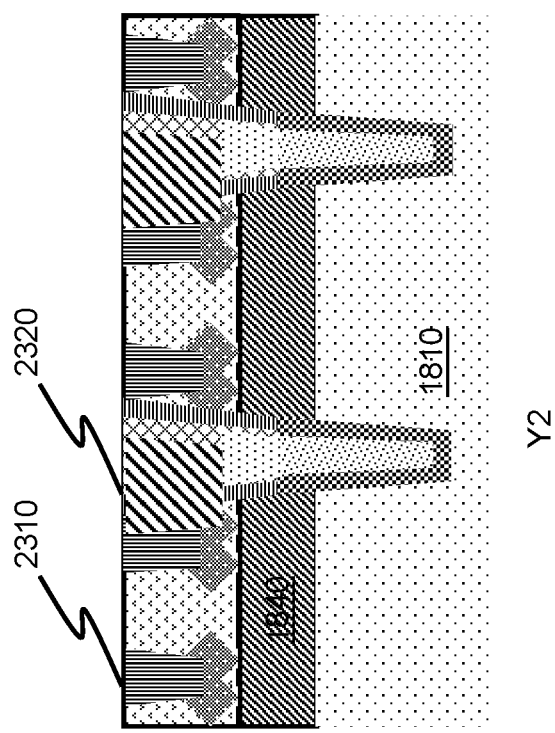
FIG. 23 provides a cross-sectional view of a step in the fabrication of a semiconductor device, according to an embodiment of the invention. The figure illustrates the device after formation of MOL S/D and VBPR contacts.

FIG. 23 illustrates device 200 following formation of middle-of-line S/D contacts 2310, and via-to buried power rail (VBPR) contacts 2320. In an embodiment, formation of contacts 2310, and VBPR contact 2320, comprises a trench metal deposition process which yields a metallized layer adjacent to and above the S-D regions 1860. In an exemplary embodiment, formation of the trench metallized layer includes forming a silicide layer between contact and epitaxial grown S/D regions 160, (e.g., Ni silicide, Ti silicide, NiPt silicide, Co silicide, etc.) followed by forming metallization materials above the silicide (e.g., a thin adhesion metal such as TiN and a bulk metal fill such as Co, W, Ru, etc., followed by CMP.

Figure 24:
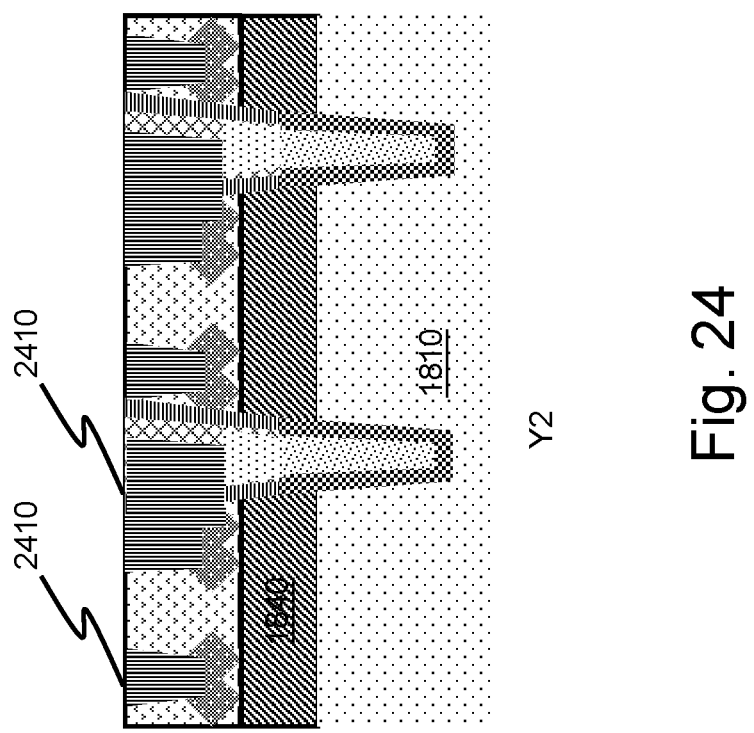
FIG. 24 provides a cross-sectional view of a step in the fabrication of a semiconductor device, according to an embodiment of the invention. The figure illustrates the device after MOL contact formation including common S/D and BPR contacts, saving masking etching and deposition steps associated with independently forming VBPR contacts.

FIG. 24 illustrates device 200 following formation of common S/D BPR contacts 2410. In an embodiment, formation of contacts 2410, comprises a trench metal deposition process which yields a metallized layer adjacent to and above the S-D regions 1860. In an exemplary embodiment, formation of the trench metallized layer includes forming a silicide layer between contact and epitaxial grown S/D regions 1860, (e.g., Ni silicide, Ti silicide, NiPt silicide, Co silicide, etc.) followed by forming metallization materials above the silicide (e.g., a thin adhesion metal such as TiN and a bulk metal fill such as Co, W, Ru, etc., followed by CMP. Forming common S/D and BPR contacts 2410 eliminates the masking, etching, and deposition steps associated with forming the VBPR contacts, resulting in saving of time and process resources.

Following formation of the contacts, the fabrication process proceeds in a manner similar to that described with respect to FIGS. 6A, 6B, and 7-13, with the formation of BEOL structures, a carrier wafer, wafer inversion, and the formation of backside power rails in contact with the buried power rails of the devices.

Figure 25:
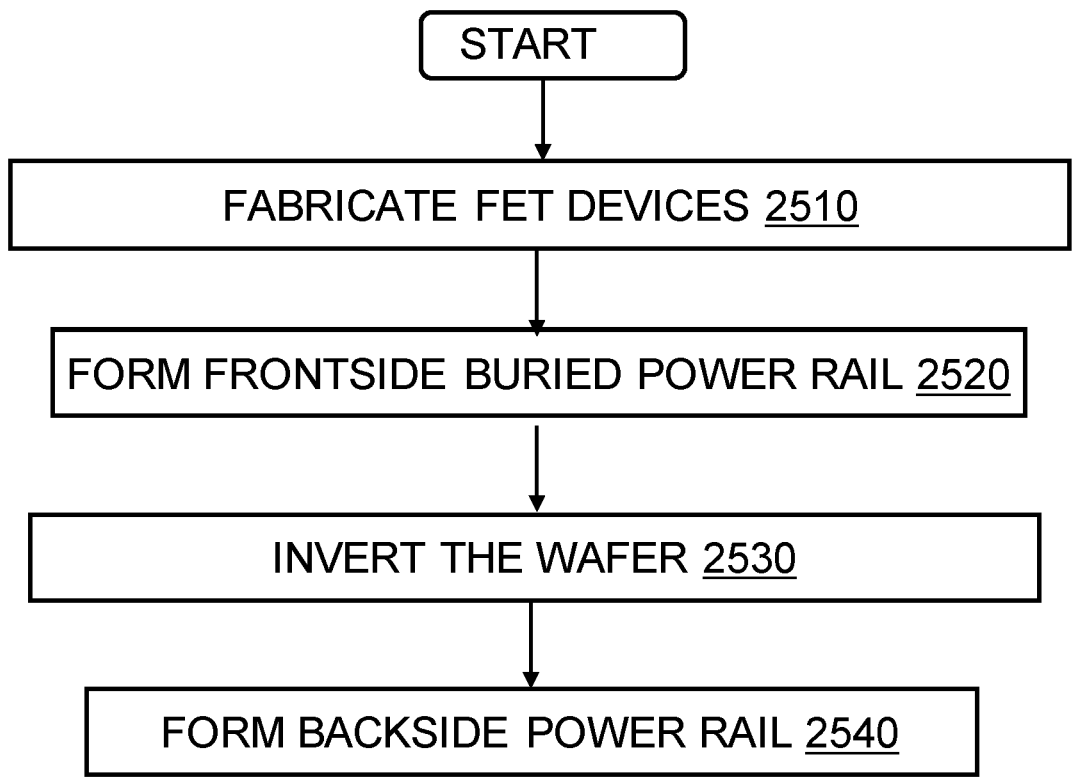
FIG. 25 provides a flowchart depicting operational steps for forming semiconductor device, according to an embodiment of the invention.

FIG. 25 illustrates a flowchart depicting exemplary fabrication stages associated with an embodiment of the invention. At block 2510, the method fabricates a plurality of FET devices upon a semiconductor wafer. In an embodiment, the fabricated FET devices comprise a pattern of devices such as PFET-NFET, NFET-PFET, PFET, disposing pairings of dissimilar FET types such that the FETs of adjacent dissimilar pair have the same type—the NFET of the first PFET-NFET pairing disposed adjacent to the NFET of the second NFET-PFET pairing.

At block 2520, forms a frontside buried power rail in a first gate cut disposed between otherwise adjacent FET devices, such as between two otherwise adjacent NFET devices, or between an NFET and a PFET device.

At block 2530, the method inverts the wafer comprising the plurality of FET devices and buried power rails disposed between otherwise adjacent FET devices, exposing the underlying substrate of the FET devices.

At block 2540, the method forms a backside power rail in contact with the frontside power rail. The backside and frontside power rails enabling the application of system power to the plurality of FET devices via the buried power rail.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a plurality of field effect transistors (FET) formed upon semiconductor fins, wherein each FET comprises a gate disposed transversely upon a first portion of the semiconductor fins of the FET, one or more source/drain regions disposed upon the semiconductor fins and in contact with the gate, and an electrically isolating layer disposed adjacent to a second portion of the semiconductor fins above the gate and the source/drain regions, the electrically isolating layer having an interface with the gate;

a buried power rail (BPR) disposed between otherwise adjacent FETs, the BPR comprising a metal rail extending beyond the interface into the gate, and electrically isolating sidewalls separating the metal rail from the gate and the source/drain regions;

and a via-buried power rail contact disposed adjacent to the electrically isolating sidewalls, in contact with the metal rail, and in contact with one source/drain region.

2. The semiconductor device according to claim 1, further comprising a first gate cut disposed between otherwise adjacent dissimilar FETs, the first gate cut comprising a single dielectric material.

3. The semiconductor device according to claim 1, further comprising a backside power rail in contact with the metal rail.

4. The semiconductor device according to claim 3, further comprising a backside power distribution network in contact with the backside power rail.

5. The semiconductor device according to claim 1, further comprising a back-end-of-line structure in contact with the via power rail contact.

6. The semiconductor device according to claim 1, further comprising a second gate cut disposed between otherwise adjacent similar FETs, the second gate cut comprising sidewalls of a first dielectric material and a second dielectric material adjacent to the sidewalls.

7. The semiconductor device according to claim 6, wherein the second gate cut further comprises the metal rail.

8. A semiconductor device comprising:
a plurality of field effect transistors (FET) formed upon fins, wherein each FET comprises a gate disposed transversely upon a first portion of the fins of the FET, one or more source/drain regions disposed upon the fins and in contact with the gate, and an electrically isolating layer disposed adjacent to a second portion of the fins, above the gate and the source/drain regions, the electrically isolating layer having a first interface with the gate and a second interface with a substrate;
a buried power rail (BPR) disposed between otherwise adjacent FETs, the BPR comprising a metal rail extending beyond the second interface, into the substrate, and electrically isolating sidewalls separating the metal rail from the substrate and the electrically isolating layer; and
a gate cut disposed above the buried power rail, the gate cut comprising dielectric sidewalls, and a metal element grown above and in contact with the metal rail; and
a via-buried power rail contact disposed in contact with the metal element and in contact with one source/drain region contact.

9. The semiconductor device according to claim 8, further comprising a second gate cut disposed between otherwise adjacent FETs, the second gate cut comprising a first dielectric material and sidewalls comprising a second dielectric material.

10. The semiconductor device according to claim 9, wherein the otherwise adjacent FETs comprise dissimilar FETs.

11. The semiconductor device according to claim 8, further comprising a backside power rail in contact with the metal rail.

12. The semiconductor device according to claim 11, further comprising a backside power distribution network in contact with the backside power rail.

13. The semiconductor device according to claim 8, further comprising a back end of line structure in contact with the via power rail contact.

14. The semiconductor device according to claim 8, wherein the buried power rail is disposed between otherwise adjacent similar FETs.

15. A semiconductor device comprising:
a plurality of field effect transistors (FET) formed upon fins, wherein each FET comprises a gate disposed transversely upon a first portion of the fins of the FET, one or more source/drain regions disposed upon the fins and in contact with the gate, and an electrically isolating layer disposed adjacent to a second portion of the fins, above the gate and the source/drain regions, the electrically isolating layer having a first interface with the gate and a second interface with a substrate;
a buried power rail (BPR) disposed between otherwise adjacent FETs, the BPR comprising a metal rail extending beyond the second interface, into the substrate, and electrically isolating sidewalls separating the metal rail from the substrate and the electrically isolating layer;
a gate cut disposed above the buried power rail, the gate cut comprising dielectric sidewalls, and a metal element grown above and in contact with the metal rail; and
a common contact disposed in contact with the metal element and in contact with one source/drain region.

16. The semiconductor device according to claim 15, further comprising a second gate cut disposed between otherwise adjacent FETs, the second gate cut comprising a first dielectric material and sidewalls comprising a second dielectric material.

17. The semiconductor device according to claim 15, wherein the buried power rail is disposed between otherwise adjacent similar FETs.

18. A semiconductor device comprising:
a plurality of field effect transistors (FET) formed upon fins, wherein each FET comprises a gate disposed transversely upon a first portion of the fins of the FET, one or more source/drain regions disposed upon the fins and in contact with the gate, and an electrically isolating layer disposed adjacent to a second portion of the fins, above the gate and the source/drain regions, the electrically isolating layer having an interface with the gate;
a buried power rail (BPR) disposed between otherwise adjacent FETs, the BPR comprising a metal rail extending beyond the interface, into the gate, and electrically isolating sidewalls separating the metal rail from the gate and the source/drain regions; and
a common contact disposed adjacent to the electrically isolating sidewalls, in contact with the metal rail, and in contact with one source/drain region.

19. The semiconductor device according to claim 18, further comprising a first gate cut disposed between otherwise adjacent dissimilar FETs, the first gate cut comprising a single dielectric material.

* * * * *